(12) United States Patent
Kim et al.

(10) Patent No.: US 8,491,955 B2
(45) Date of Patent: Jul. 23, 2013

(54) METHOD OF MANUFACTURING ELECTRONIC APPARATUS INCLUDING PLASTIC SUBSTRATE, ELECTRONIC APPARATUS MANUFACTURED USING THE METHOD, AND APPARATUS FOR USE IN THE METHOD

(75) Inventors: Tae-Woong Kim, Yongin (KR);
Dong-Un Jin, Yongin (KR);
Hyun-Joong Chung, Yongin (KR);
Jae-Seob Lee, Yongin (KR); Yeon-Gon Mo, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 718 days.

(21) Appl. No.: 12/620,569

(22) Filed: Nov. 17, 2009

(65) Prior Publication Data

US 2010/0124635 A1    May 20, 2010

(30) Foreign Application Priority Data

Nov. 18, 2008 (KR) ........................ 10-2008-0114748

(51) Int. Cl.
*B05D 5/12*     (2006.01)
*C23C 16/00*    (2006.01)

(52) U.S. Cl.
USPC ......... 427/58; 427/96.1; 427/126.3; 427/289; 427/554; 118/728; 118/504

(58) Field of Classification Search
USPC ............ 427/58, 64, 66, 69, 70; 118/728–729, 118/504
See application file for complete search history.

(56) References Cited

U.S. PATENT DOCUMENTS

| 6,572,780 | B2* | 6/2003 | McCormack et al. ........... 216/13 |
| 7,232,591 | B2* | 6/2007 | Okumura et al. ............ 427/569 |
| 7,989,314 | B2* | 8/2011 | Lee et al. ...................... 438/458 |
| 2006/0037934 | A1* | 2/2006 | Suginoya et al. ............... 216/13 |
| 2007/0059854 | A1* | 3/2007 | Huang et al. ................... 438/30 |

FOREIGN PATENT DOCUMENTS

| JP | 04-290495 | 10/1992 |
| JP | 2000-321544 | 11/2000 |
| JP | 2007-005805 | 1/2007 |
| KR | 20-0213582 | 2/2001 |
| KR | 10-2008-0054167 | 6/2008 |

* cited by examiner

*Primary Examiner* — Dah-Wei Yuan
*Assistant Examiner* — Jose Hernandez-Diaz
(74) *Attorney, Agent, or Firm* — Christie, Parker & Hale, LLP

(57) ABSTRACT

A method of manufacturing an electronic apparatus including a plastic substrate, which can facilitate in separating the electronic apparatus including the plastic substrate from a stage, an electronic apparatus manufactured using the method, and an apparatus including the stage for use in the method. The method includes: preparing a stage on which a plurality of island-shaped separation lubricators are arranged; disposing the plastic substrate on the stage; forming a device on the plastic substrate; and separating the plastic substrate from the stage.

14 Claims, 4 Drawing Sheets

METHOD OF MANUFACTURING ELECTRONIC APPARATUS INCLUDING PLASTIC SUBSTRATE, ELECTRONIC APPARATUS MANUFACTURED USING THE METHOD, AND APPARATUS FOR USE IN THE METHOD

CROSS-REFERENCE TO RELATED PATENT APPLICATION

This application claims priority to and the benefit of Korean Patent Application No. 10-2008-0114748, filed on Nov. 18, 2008, in the Korean Intellectual Property Office, the entire content of which is incorporated herein by reference.

BACKGROUND OF THE INVENTION

1. Field of the Invention

The following description relates to a method of manufacturing an electronic apparatus including a plastic substrate, an electronic apparatus manufactured using the method, and an apparatus for use in the method.

2. Description of the Related Art

In general, a flexible electronic apparatus, such as a flexible display apparatus, includes a plastic substrate. A method of manufacturing an electronic apparatus includes disposing a plastic substrate on a stage formed of a glass material and arranging various devices on the plastic substrate.

In order to place the various devices at precise positions on the plastic substrate, the plastic substrate should not be separated from the stage when forming the various devices. For example, when a semiconductor layer, a gate insulating layer, a gate electrode, and source/drain electrodes are formed in order to form a thin film transistor on the plastic substrate, if the plastic substrate were to be displaced with respect to the stage, the thin film transistor may be damaged. On the other hand, once the electronic apparatus including the plastic substrate is completely manufactured, the plastic substrate should be easily separated from the stage. If the plastic substrate were not easily separated from the stage, the plastic substrate or the various devices formed on the plastic substrate may be damaged while the plastic substrate is separated from the stage.

As such, there is a need to develop a method of manufacturing an electronic apparatus including a plastic substrate which can overcome the aforesaid problems.

SUMMARY OF THE INVENTION

An aspect of an embodiment of the present invention is directed toward a method of manufacturing an electronic apparatus including a plastic substrate, which can facilitate in separating the electronic apparatus including the plastic substrate from a stage, an electronic apparatus manufactured using the method, and an apparatus for use in the method.

According to an embodiment of the present invention, there is provided a method of manufacturing an electronic apparatus including a plastic substrate. The method includes: preparing a stage on which a plurality of island-shaped separation lubricators are arranged; disposing the plastic substrate on the stage with the plurality of island-shaped separation lubricators therebetween; forming a device on the plastic substrate; and separating the plastic substrate from the stage.

The preparing of the stage may include forming a plurality of island-shaped separation lubricators on the stage.

An adhesive force between the island-shaped separation lubricators and the stage may be greater than an adhesive force between the island-shaped separation lubricators and the plastic substrate.

An adhesive force between the plastic substrate and the island-shaped separation lubricators may be less than an adhesive force between the plastic substrate and the stage.

The stage may be formed of a glass material.

The separation lubricators may be formed of a silicon oxide and/or silicon nitride material.

The plastic substrate may be formed of a polyimide material.

The disposing of the plastic substrate may include forming the plastic substrate on the stage by utilizing slit coating.

The preparing of the stage may include forming the plurality of island-shaped separation lubricators and an anti-peeling member on the stage, the plurality of island-shaped separation lubricators being in a first region on the stage, the anti-peeling member being outside the first region of the island-shaped separation lubricators.

The anti-peeling member surrounds the first region of the island-shaped separation lubricators.

The anti-peeling member may include a plurality of anti-peeling units spaced apart from one another.

An adhesive force between the anti-peeling member and the plastic substrate may be greater than an adhesive force between the stage and the plastic substrate.

The separating of the plastic substrate may include separating the plastic substrate from the stage by cutting the plastic substrate along a cutting line that is located between the anti-peeling member and the island-shaped separation lubricators.

The anti-peeling member may include a material selected from the group consisting of aluminum oxides, gallium oxides, boron oxides, magnesium oxides, calcium oxides, strontium oxides, and combinations thereof.

The anti-peeling member may have a band gap between about 4 and about 9 eV.

The preparing of the stage may include: forming the plurality of island-shaped separation lubricators in the first region on the stage; and forming the anti-peeling member outside the first region of the island-shaped separation lubricators so that the anti-peeling member surrounds the first region of the island-shaped separation lubricators.

According to another embodiment of the present invention, there is provided an electronic apparatus including a plastic substrate, which is manufactured using the above method.

According to another embodiment of the present invention, there is provided an apparatus including a stage having a surface on which a plurality of island-shaped separation lubricators are disposed.

An adhesive force between the separation lubricators and the stage may be greater than an adhesive force between the separation lubricators and a plastic substrate.

An adhesive force between the separation lubricators and a plastic substrate may be less than an adhesive force between the stage and the plastic substrate.

The stage may be formed of a glass material.

The separation lubricators may be formed of a silicon oxide and/or silicon nitride material.

The apparatus may further include an anti-peeling member on the surface of the stage and outside a region in which the island-shaped separation lubricators are disposed.

The anti-peeling member may surround the region in which the island-shaped separation lubricators are disposed.

The anti-peeling member may include a plurality of anti-peeling units spaced apart from one another.

An adhesive force between the anti-peeling member and a plastic substrate may be greater than an adhesive force between the stage and the plastic substrate.

The anti-peeling member may include a material selected from the group consisting of aluminum oxides, gallium oxides, boron oxides, magnesium oxides, calcium oxides, strontium oxides, and combinations thereof.

The anti-peeling member may have a band gap between about 4 and about 9 eV.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION OF THE INVENTION

Figure 1A:
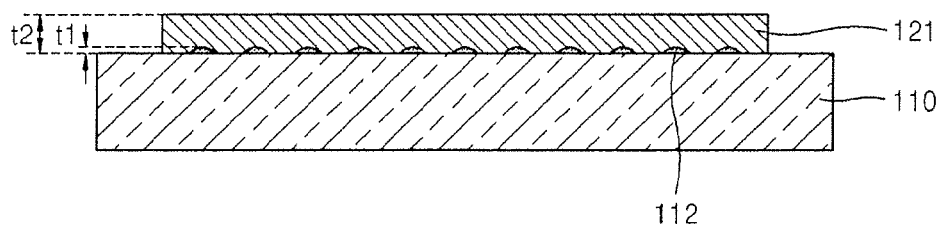
FIGS. 1A, 1B, and 1C are cross-sectional schematic views illustrating a method of manufacturing an electronic apparatus, according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Figure 1B:
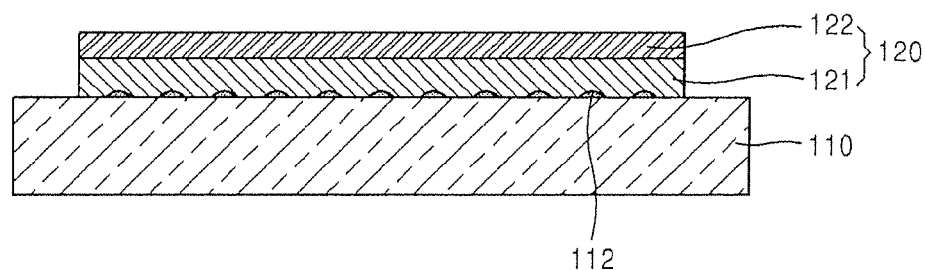
Figure 1C:
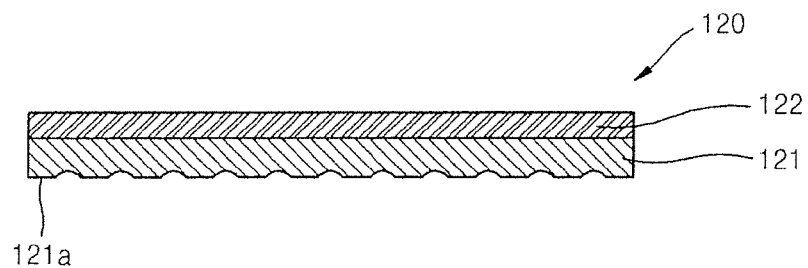

FIGS. 1A through 1C are cross-sectional schematic views illustrating a method of manufacturing an electronic apparatus, according to an embodiment of the present invention.

Referring to FIG. 1A, a stage 110 on which a plurality of island-shaped separation lubricators 112 are disposed is prepared. A plastic substrate 121 is disposed on the stage 110. The plastic substrate 121 may be disposed on the stage 110 in various ways, for example, to form the plastic substrate 121 by coating a plastic substrate forming material on the stage 110 and then hardening the plastic substrate forming material. In doing so, an adhesive force is created between the plastic substrate 121 and the stage 110, and thus the plastic substrate 121 can be prevented or protected from being separated from the stage 110 while devices are formed on the plastic substrate 121 in a subsequent process. However, if the plastic substrate 121 is first formed and then disposed on the stage 110, the plastic substrate 121 may be separated from the stage 110 while devices are formed on the plastic substrate 121 in a subsequent process.

The plastic substrate 121 may be disposed on the stage 110 by spin coating a plastic substrate forming material onto the stage 110. Spin coating is a procedure that may be used to uniformly apply a plastic substrate forming material to the stage 110 by coating the plastic substrate forming material on at least one portion of the stage 110 and rotating the plastic substrate forming material. However, spin coating may cause excess plastic substrate forming material to spin off the stage 100, and thus manufacturing costs may be increased. To reduce the amount of plastic substrate forming material used, the plastic substrate 121 may be disposed on the stage 110 by slit coating. Slit coating is a procedure that may be used to uniformly apply a plastic substrate forming material onto the stage 110 by discharging the plastic substrate forming material from slits.

Referring to FIG. 1B, a device 122 is formed on the plastic substrate 121 to form an electronic apparatus 120 including the plastic substrate 121 and the device 122. Although the device 122 is formed as one layer in FIG. 1B, the present invention is not limited thereto, and the device 122 may have various suitable structures. For example, the device 122 may be a thin film transistor, an organic light emitting device, or a combination thereof. If the device 122 is an organic light emitting device including a pixel electrode, a counter electrode facing the pixel electrode, and an intermediate layer interposed between the pixel electrode and the counter electrode, the electronic apparatus 120 may be an organic light emitting display apparatus. Of course, various other suitable processes including a process of forming a protective layer and/or a sealing substrate after the device 122 is formed on the plastic substrate 121 may be performed.

Referring to FIG. 1C, the plastic substrate 121 is separated from the stage 110 to complete the manufacture of the electronic apparatus 120 including the plastic substrate 121. Another suitable electronic apparatus may be manufactured by using the electronic apparatus 120 manufactured using the method of FIGS. 1A through 1C.

In order to form the device 122 at a precise position on the plastic substrate 121, the plastic substrate 121 should not be separated from the stage 110 when forming the device 122. Accordingly, there should be an adhesive force between the plastic substrate 121 and the stage 110 so as not to move the plastic substrate 121 while the device 122 is formed on the plastic substrate 121. On the other hand, after the completion of the manufacture of the electronic apparatus 120 including the plastic substrate 121 and the device 122, the plastic substrate 121 should be easily separated from the stage 110. If the plastic substrate 121 is not easily separated from the stage 110, the plastic substrate 121 or the device 122 formed on the plastic substrate 121 may be damaged while the plastic substrate 121 is separated from the stage 110.

Accordingly, the method of FIGS. 1A through 1C uses the stage 110 on which a plurality of island-shaped separation lubricators 112 are disposed. That is, the plastic substrate 121 is disposed on the stage 110 to have an adhesive force between the plastic substrate 121 and the stage 110, and in order to easily separate the plastic substrate 121 from the stage 110 when necessary, the plurality of island-shaped separation lubricators 112 are disposed on the stage 110 to reduce the adhesive force between the plastic substrate 121 and the stage 110. As a result, the adhesive force in regions where the plastic substrate 121 contacts the island-shaped separation lubricators 112 is reduced and the adhesive force in regions of the stage 110 other than the regions where the plastic substrate 121 contacts the island-shaped separation lubricators 112 is maintained. Thus, the plastic substrate 121 is usually attached to the stage 110, and when desired, the plastic substrate 121 can be easily separated from the stage 110 without damaging the plastic substrate 121 and/or the device 122 formed on the plastic substrate 121.

To this end, an adhesive force between the plastic substrate 121 and the island-shaped separation lubricators 112 should be less than the adhesive force between the plastic substrate 121 and the stage 110. To this end, the plastic substrate 121 may be formed of polyimide, the stage 110 may be formed of a glass material, and the island-shaped separation lubricators 112 may be formed of a silicon oxide and/or a silicon nitride. An adhesive force between the island-shaped separation lubricators 112 and the stage 110 may be greater than the adhesive force between the island-shaped separation lubricators 112 and the plastic substrate 121. In doing so, when the plastic substrate 121 is separated from the stage 110, the island-shaped separation lubricators 112 can be prevented from being separated from the stage 110 and attached to the plastic substrate 121.

When the electronic apparatus 120 including the plastic substrate 121 is manufactured, curves conforming to the island-shaped separation lubricators 112 may be formed in a surface 121a of the plastic substrate 121 of the electronic apparatus 120. However, the sizes of the curves formed in the surface 121a of the plastic substrate 121 and the island-shaped separation lubricators 112 illustrated in FIGS. 1A through 1C are exaggerated for illustrative purposes. Referring to FIG. 1A, the curves formed in the surface 121a of the plastic apparatus 120 manufactured using the method of FIGS. 1A through 1C may not be normally recognized by a user because the island-shaped separation lubricators 112 have a thickness t1 of about several to tens of nanometers compared to the plastic substrate 121 having a thickness t2 of about several micrometers.

The island-shaped separation lubricators 112 formed on the stage 110 may be damaged while the electronic apparatus 120 is manufactured using the method of FIGS. 1A through 1C. Accordingly, in certain circumstances, before the plastic substrate 121 is formed on the stage 110, the plurality of island-shaped separation lubricators 112 may be formed on the stage 110. Also, various suitable modifications to the method of manufacturing may be made. For example, the plastic substrate 121 may be separated from the stage 110 and then a film may be coated on the surface 121a of the plastic substrate 121 to planarize the surface 121a of the plastic substrate 121.

Figure 2A:
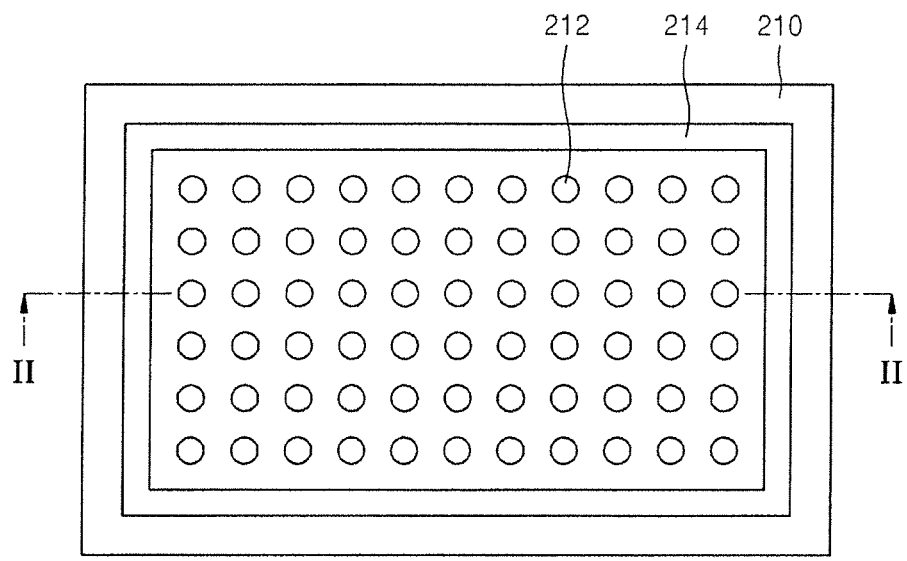
FIG. 2A is a plan schematic view and FIGS. 2B, 2C, 2D, 2E, and 2F are cross-sectional schematic views illustrating a method of manufacturing an electronic apparatus, according to another embodiment of the present invention.

FIG. 2A is a plan schematic view and FIGS. 2B, 2C, 2D, 2E, and 2F are cross-sectional schematic views illustrating a method of manufacturing an electronic apparatus, according to another embodiment of the present invention.

Figure 2B:
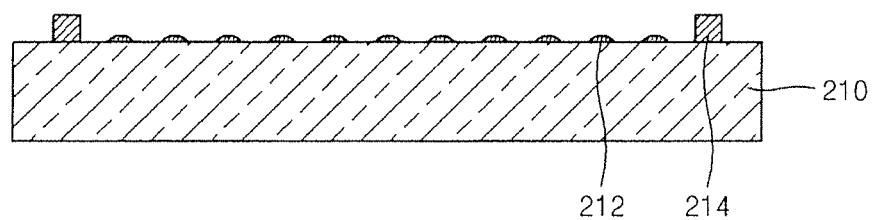

Referring to FIGS. 2A and 2B, a plurality of island-shaped separation lubricators 212 are disposed on a stage 210 in a first region and an anti-peeling member 214 is disposed outside the first region of the plurality of island-shaped separation lubricators 212 to surround the first region in which the island-shaped separation lubricators 212 are disposed.

Figure 2C:
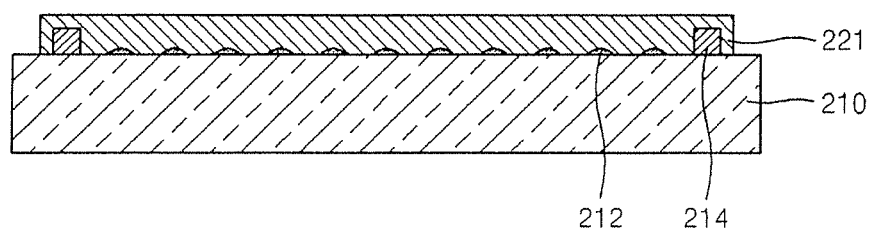

Referring to FIG. 2C, a plastic substrate 221 is disposed on the stage 210 by coating a plastic substrate forming material on the stage 210 and then hardening the plastic substrate forming material. Here, in one embodiment, slit coating is utilized rather than spin coating in consideration of the amount of the plastic substrate forming material used. When slit coating is used, the plastic substrate 221 is formed on the stage 210 to expose an outer periphery (or periphery regions) of the stage 210, such as shown in FIG. 2C. However, when the plastic substrate 221 is formed on the stage 210, if the island-shaped separation lubricators 212 are used in order to easily separate the plastic substrate 221 from the stage 210 in a subsequent process, the plastic substrate 221 may be separated from the stage 210 during a manufacturing process. That is, since an overall adhesive force between the plastic substrate 221 and the stage 210 is reduced due to the island-shaped separation lubricators 212, the plastic substrate 221 may be separated from the stage 210 during the manufacturing process.

Accordingly, in the method of FIGS. 2A through 2F, the anti-peeling member 214 as well as the island-shaped separation lubricators 212 are formed on the stage 210 in order to prevent the separation of the plastic substrate 221 from the stage 210 during the manufacturing process. That is, the method of FIGS. 2A through 2F allows the plastic substrate 221 to be easily separated from the stage 210 in a subsequent process by using the island-shaped separation lubricators 212, and protects or prevents the plastic substrate 221 from being separated from the stage 210 during a manufacturing process by using the anti-peeling member 214 that is disposed along an outer periphery of the plastic substrate 221. To this end, an adhesive force between the anti-peeling member 214 and the plastic substrate 221 may be greater than an adhesive force between the stage 210 and the plastic substrate 221. Accordingly, the overall adhesive force between the plastic substrate 221 and the stage 210 including the anti-peeling member 214 is increased, thereby protecting or preventing the plastic substrate 210 from being separated from the stage 210 during the manufacturing process. The anti-peeling member 214 may be formed of a material selected from the group consisting of aluminium oxides, gallium oxides, boron oxides, magnesium oxides, calcium oxides, strontium oxides, and combinations thereof.

The anti-peeling member 214 may be formed of an oxide material having a band gap between about 4 eV and about 9 eV. The plastic substrate 221 is separated from the stage 210 by irradiating a laser beam having a wavelength of 308 nm onto the plastic substrate 221 to cut the plastic substrate 221 as will be described later with reference to FIG. 2E. Although the anti-peeling member 214 is exposed to the laser beam in the cutting process, the anti-peeling member 214 should not react to the laser beam. That is, since the laser beam used to separate the plastic substrate 221 from the stage 210 has a wavelength of 308 nm, the anti-peeling member 214 may be formed of a material having a band gap greater than 4 eV with respect to the laser beam having the wavelength of 308 nm.

Figure 2D:
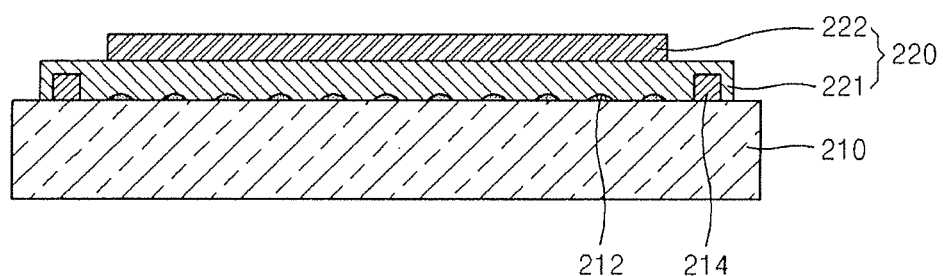
Figure 2E:
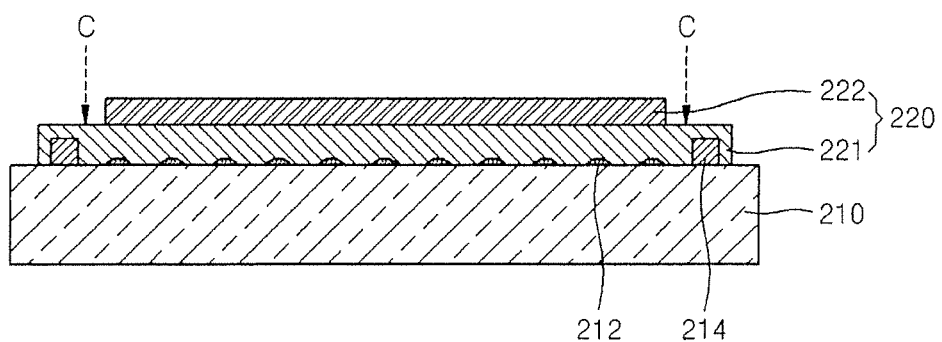
Figure 2F:
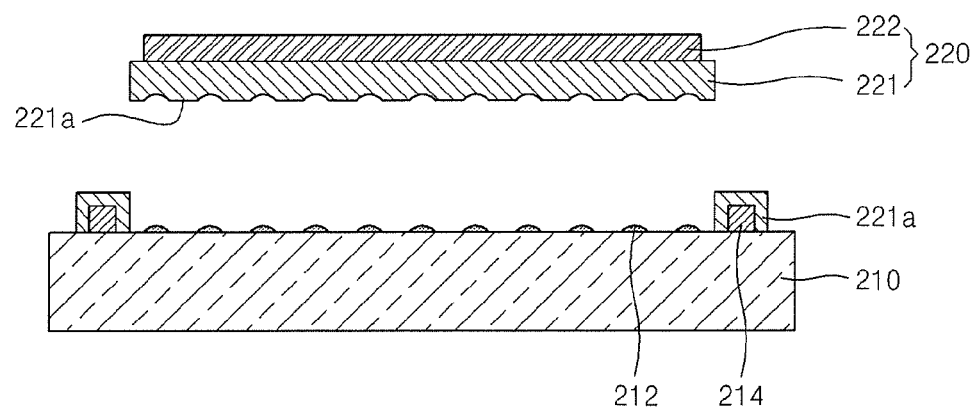

Referring to FIG. 2C, the plastic substrate 221 is formed on the stage 210 including the island-shaped separation lubricators 212 and the anti-peeling member 214. Referring to FIG. 2D, a device 222 is formed on the plastic substrate 221 to form an electronic apparatus 220 including the plastic substrate 221 and the device 222. Next, the plastic substrate 221 should be separated from the stage 210. However, the plastic substrate 221 may not be easily separated from the stage 210 due to the anti-peeling member 214. Accordingly, referring to FIG. 2E, a cutting line C is determined to be located between the anti-peeling member 214 and the island-shaped separation lubricators 212, and referring to FIG. 2F, the plastic substrate 221 may be separated from the stage 210 by cutting the plastic substrate 221 along the cutting line C. The plastic substrate 221 may be cut by irradiating a laser beam as described above.

Figure 3:
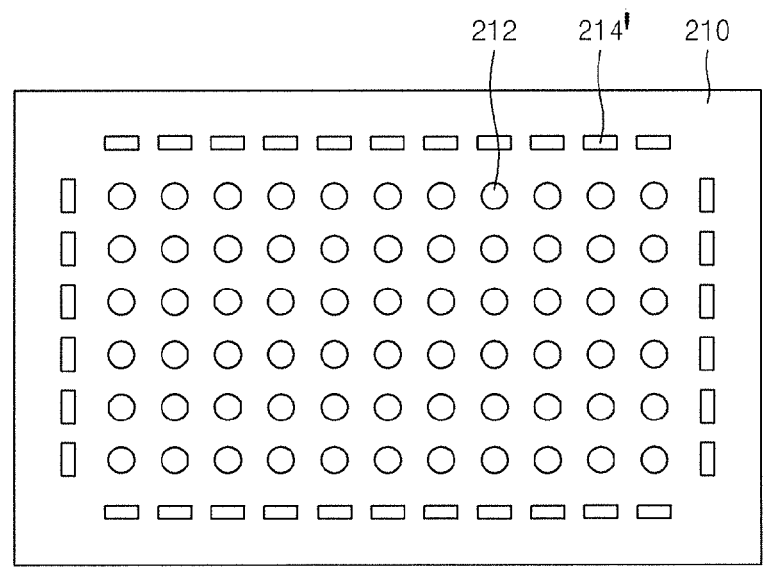
FIG. 3 is a plan schematic view for explaining a method of manufacturing an electronic apparatus, according to another embodiment of the present invention.

FIG. 3 is a plan schematic view for explaining a method of manufacturing an electronic apparatus, according to another embodiment of the present invention. The embodiment with the stage 210 of FIG. 3 is different from the embodiment with the stage 210 of FIG. 2A in the shape/structure of its anti-peeling member. That is, in FIG. 2A, the anti-peeling member 214 is formed in a single continuous unit to surround the plurality of island-shaped separation lubricators 212. However, in FIG. 3, a plurality of anti-peeling members or units 214' are disposed on the stage 210 to be spaced apart from one another, in such a way as to surround the plurality of island-shaped separation lubricators 212.

While the electronic apparatus 222 is manufactured by using the method of FIG. 3, the island-shaped separation lubricators 212 and the anti-peeling members or units 214' formed on the stage 210 may be damaged. Accordingly, in one embodiment, before the plastic substrate 221 is formed on the stage 210, the plurality of island-shaped separation lubricators 212 is formed on the stage 210, and the anti-peeling members or units 214' are also formed on the stage 210 to surround the island-shaped separation lubricators 212. Also, various suitable modifications to the method of manufacturing may be made. For example, after the plastic substrate 221 is separated from the stage 210, a film may be coated on the surface 221a of the plastic substrate 221 to planarize the surface 221a.

The electronic apparatuses 120 and 220 respectively manufactured using the methods of FIGS. 1 and 2 have various aspects/enhancements, including flexibility, because of the plastic substrates 121 and 221. Since both the plastic substrates 121 and 221 and the devices 122 and 222 formed on the plastic substrates 121 and 221 are protected or prevented from being damaged during the manufacturing process of the electronic apparatuses 120 and 220, the yield of the electronic apparatuses 120 and 220 can be dramatically increased.

An apparatus including a stage used to manufacture an electronic apparatus using the methods of FIGS. 1 and 2 will now be explained. Referring to FIG. 1A, the apparatus includes the stage 110 having a surface on which the plurality of island-shaped separation lubricators 112 are disposed. The adhesive force between the island-shaped separation lubricators 112 and the stage 110 may be greater than the adhesive force between the island-shaped separation lubricators 112 and the plastic substrate 121, and the adhesive force between the island-shaped separation lubricators 112 and the plastic substrate 121 may be less than the adhesive force between the stage 110 and the plastic substrate 121. The stage 110 may be formed of a glass material, and the island-shaped separation lubricators 112 may be formed of silicon oxide and/or silicon nitride.

Also, referring to FIGS. 2A and 2B, the apparatus used to manufacture an electronic apparatus using the methods of FIGS. 1 through 3 may further include the anti-peeling member 214 surrounding the island-shaped separation lubricators 212. Referring to FIG. 3, the apparatus may include the plurality of anti-peeling members or units 214' spaced apart from one another. The plastic substrate 221 may be prevented or protected from being separated from the stage 210 when an electronic apparatus is manufactured by using such an apparatus by making the adhesive force between the anti-peeling member 214 or members 214' and the plastic substrate 221 greater than an adhesive force between the stage 210 and the plastic substrate 221. The anti-peeling member 214 or members 214' may include a material selected from the group consisting of aluminium oxides, gallium oxides, boron oxides, magnesium oxides, calcium oxides, strontium oxides, and combinations thereof. Also, the anti-peeling member 214 may be formed of an oxide material having a band gap between 4 and 9 eV as described above.

As described above, the method of manufacturing the electronic apparatus including the plastic substrate, the electronic apparatus manufactured using the method, and the apparatus used to manufacture the electronic apparatus for use in the method according to embodiments of the present invention can facilitate in separating the electronic apparatus including the plastic substrate from its manufacturing stage.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing an electronic apparatus comprising a plastic substrate, the method comprising:
   preparing a stage with a plurality of island-shaped separation lubricators and an anti-peeling member, wherein the preparing of the stage comprises forming the plurality of island-shaped separation lubricators and the anti-peeling member on the stage, the plurality of island-shaped separation lubricators being in a first region on the stage, the anti-peeling member being outside the first region of the island-shaped separation lubricators;
   disposing the plastic substrate on the stage with the plurality of island-shaped separation lubricators therebetween;
   forming an electronic device on the plastic substrate; and
   separating the plastic substrate from the stage, wherein the separating of the plastic substrate comprises separating the plastic substrate from the stage by cutting the plastic substrate along a cutting line that is located between the anti-peeling member and the island-shaped separation lubricators.

2. The method of claim 1, wherein the preparing of the stage comprises forming the plurality of island-shaped separation lubricators on the stage.

3. The method of claim 1, wherein an adhesive force between the island-shaped separation lubricators and the stage is greater than an adhesive force between the island-shaped separation lubricators and the plastic substrate.

4. The method of claim 1, wherein an adhesive force between the plastic substrate and the island-shaped separation lubricators is less than an adhesive force between the plastic substrate and the stage.

5. The method of claim 1, wherein the stage comprises a glass material.

6. The method of claim 1, wherein the island-shaped separation lubricators comprises a silicon oxide and/or silicon nitride material.

7. The method of claim 1, wherein the plastic substrate comprises a polyimide material.

8. The method of claim 1, wherein the disposing of the plastic substrate comprises forming the plastic substrate on the stage by utilizing slit coating.

9. The method of claim 1, wherein the anti-peeling member surrounds the first region of the island-shaped separation lubricators.

10. The method of claim 9, wherein the anti-peeling member comprises a plurality of anti-peeling units spaced apart from one another.

11. The method of claim 1, wherein an adhesive force between the anti-peeling member and the plastic substrate is greater than an adhesive force between the stage and the plastic substrate.

12. The method of claim 1, wherein the anti-peeling member comprises a material selected from the group consisting of aluminum oxides, gallium oxides, boron oxides, magnesium oxides, calcium oxides, strontium oxides, and combinations thereof.

13. The method of claim 1, wherein the anti-peeling member has a band gap between about 4 and about 9 eV.

14. The method of claim 1, wherein the preparing of the stage comprises:
   forming the plurality of island-shaped separation lubricators in the first region on the stage; and forming the anti-peeling member outside the first region of the island-shaped separation lubricators so that the anti-peeling member surrounds the first region of the island-shaped separation lubricators.

\* \* \* \* \*